United States Patent
Choi (10) Patent No.: US 6,727,585 B2
(45) Date of Patent: Apr. 27, 2004

(54) POWER DEVICE WITH A PLASTIC MOLDED PACKAGE AND DIRECT BONDED SUBSTRATE

(75) Inventor: Kang Rim Choi, Cupertino, CA (US)

(73) Assignee: Ixys Corporation, Santa Clara, CA (US)

(*) Notice: Subject to any disclaimer, the term of this patent is extended or adjusted under 35 U.S.C. 154(b) by 0 days.

(21) Appl. No.: 10/099,061

(22) Filed: Mar. 13, 2002

(65) Prior Publication Data

US 2002/0163074 A1 Nov. 7, 2002

Related U.S. Application Data

(60) Provisional application No. 60/288,855, filed on May 4, 2001.

(51) Int. Cl.$^7$ .............................................. H01L 23/124
(52) U.S. Cl. ......................... 257/728; 257/723; 257/706
(58) Field of Search ................................. 291/723, 724, 291/735, 736; 257/730, 706, 787, 707, 691, 728

(56) References Cited

U.S. PATENT DOCUMENTS

| | | |
|---|---|---|
| 3,651,434 A | 3/1972 | McGeough et al. |
| 3,763,403 A | 10/1973 | Lootens |
| 3,769,560 A | 10/1973 | Miyake et al. |
| 3,784,883 A | 1/1974 | Duncan et al. |
| 3,908,185 A | 9/1975 | Martin |
| 4,278,990 A | 7/1981 | Fichot |
| 4,483,810 A | 11/1984 | Bunk et al. |
| 4,558,510 A | 12/1985 | Tani et al. |
| 4,563,383 A | 1/1986 | Kuneman et al. |
| 4,878,106 A | 10/1989 | Sachs |
| 4,891,686 A | 1/1990 | Krausse, III |
| 4,925,024 A | 5/1990 | Ellenberger et al. |
| 5,075,759 A | 12/1991 | Moline |
| 5,164,885 A | 11/1992 | Drye et al. |
| 5,198,885 A | 3/1993 | Ibrahim |
| 5,291,065 A * | 3/1994 | Arai et al. |
| 5,338,974 A | 8/1994 | Wisherd et al. |
| 5,455,448 A | 10/1995 | Benjamin |
| 5,488,252 A | 1/1996 | Johansson et al. |
| 5,519,936 A | 5/1996 | Andros et al. |
| 5,561,323 A | 10/1996 | Andros et al. |
| 5,596,231 A | 1/1997 | Combs |
| 5,601,932 A | 2/1997 | Krum et al. |
| 5,637,922 A | 6/1997 | Fillion et al. |
| 5,646,445 A * | 7/1997 | Masumoto et al. |

(List continued on next page.)

FOREIGN PATENT DOCUMENTS

| DE | 19931694 | 1/2001 |
|---|---|---|
| JP | 402281737 A | 11/1990 |

OTHER PUBLICATIONS

Burgess et al., "Hybrid Packages by the Direct Bonded Copper Process," *Solid State Technology*, pp. 42–44 (May 1975).

Gioia, J. Charles, "MIC Package Using Thick Film and Direct Bond Copper* for 100–W L–Band Power Amplifier," *Proceedings of 1979 Int. Microelectronics Symposium*, pp. 214–218, held Nov. 13–15, 1975 in Los Angeles, CA.

*Primary Examiner*—Sheila V. Clark
(74) *Attorney, Agent, or Firm*—Townsend and Townsend and Crew LLP (57) ABSTRACT

A power device compatible with an SOT 227 package standard. The device includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. The first conductive layer has been patterned to provide at least first and second conductive blocks. A semiconductor die is bonded to the first block of the first conductive layer of the substrate. A terminal lead is coupled to the second block of the first conductive layer of the substrate.

22 Claims, 7 Drawing Sheets

U.S. PATENT DOCUMENTS

| | | |
|---|---|---|
| 5,650,662 A | 7/1997 | Edwards et al. |
| 5,675,181 A | 10/1997 | Nishiura et al. |
| 5,696,466 A | 12/1997 | Li |
| 5,698,898 A * | 12/1997 | Matsumoto |
| 5,760,473 A | 6/1998 | Dickson et al. |
| 5,767,573 A | 6/1998 | Noda et al. |
| 5,783,466 A | 7/1998 | Takahashi |
| 5,808,357 A | 9/1998 | Sakoda et al. |
| 5,834,840 A | 11/1998 | Robbins et al. |
| 5,877,555 A | 3/1999 | Leighton et al. |
| 5,889,319 A | 3/1999 | Moller et al. |
| 5,942,797 A | 8/1999 | Terasawa |
| 6,020,636 A | 2/2000 | Adishian |
| 6,043,111 A | 3/2000 | Furuse |
| 6,056,186 A | 5/2000 | Dickson et al. |
| 6,181,200 B1 | 1/2001 | Titizian et al. |
| 6,232,657 B1 * | 5/2001 | Komorita et al. |
| 6,359,331 B1 * | 3/2002 | Rinchart et al. |
| 6,404,065 B1 | 6/2002 | Choi |
| 6,534,343 B2 * | 3/2003 | Choi |
| 6,583,505 B2 * | 6/2003 | Choi |

* cited by examiner

POWER DEVICE WITH A PLASTIC MOLDED PACKAGE AND DIRECT BONDED SUBSTRATE

CROSS-REFERENCES TO RELATED APPLICATIONS

This application claims priority to U.S. Provisional Patent Application No. 60/288,855, filed on May 4, 2001, which is incorporated by reference herein for all purposes.

BACKGROUND OF THE INVENTION

This invention relates to electronic devices, and more particularly to a packaged power semiconductor device with a metal back plate that is electrically isolated from the terminals of the device.

Electronic semiconductor device technology continues to rapidly advance, producing devices that achieve heretofore unattainable operating speeds, packing density, and high-temperature compatibility. This last characteristic, high-temperature compatibility, is one of more important features. High-temperature environments as well as high-power and high frequency applications are becoming increasingly important. The ability of electronics to withstand high-temperature environments such as gas-turbines, automotive engine compartments, materials handling and fabrication equipment, and aircraft subsystems makes possible many historically impractical electronic applications for these environments.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection, such as hermetic sealing.

In designing such packages, thermal management is important—especially at high power generation levels which increase the amount of heat created. Heat decreases the performance and operating life of the transistor. Moreover, heat generated at the collector-base junction can create a temperature buildup which may eventually cause the device to short-circuit.

The power device may be mounted on a thermally conductive pad which acts as a heat sink and dissipates the heat generated by the power device. In order to prevent electrical losses, however, the thermally conductive pad must also be electrically insulating. Hence, a thermally conducting, electrically insulating material, e.g., beryllia (beryllium oxide—BeO) and alumina (aluminum oxide), is used for the mounting pad.

BRIEF SUMMARY OF THE INVENTION

The invention provides a packaged power semiconductor device having electrical isolation between the potential of a die inside the package and a metal back side of the package. In one embodiment, a power device compatible with an SOT 227 package standard includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. The first conductive layer has been patterned to provide at least first and second conductive blocks. A semiconductor die is bonded to the first block of the first conductive layer of the substrate. A terminal lead is coupled to the second block of the first conductive layer of the substrate.

A further understanding of the nature and advantages of the present invention may be realized by reference to the remaining portions of the specification and the drawings.

DESCRIPTION OF THE SPECIFIC EMBODIMENTS

Embodiments of the present invention use direct bonded metal substrates and plastic packages for power devices, thereby providing a simplified construction of a power device package for mass production with automation, reduced costs, reduced thermal fatigue problem associated with multi-layered packages, reduced thermal resistance of the package, reduced thermal fatigue effect, and the like.

As used herein, the term "direct bonded metal substrate" refers to a substrate comprising a dielectric layer and a conductive layer bonded to each other by heating them to a temperature between the eutectic and melting temperatures of the conductive layer. The conductive layers may be copper, aluminum, or the like. The dielectric layer may be aluminum nitride, alumina, or other ceramic materials. Examples of the direct bonded metal substrate includes a direct bonded copper (DCB) or direct copper bonded (DBC) substrate, a direct aluminum bonded (DAB) substrate, and the like. Generally, the direct bonded metal substrate has two conductive layers with a dielectric layer provided therebetween. A more detail description of the direct bonded metal substrate will be provided later.

Figure 1:
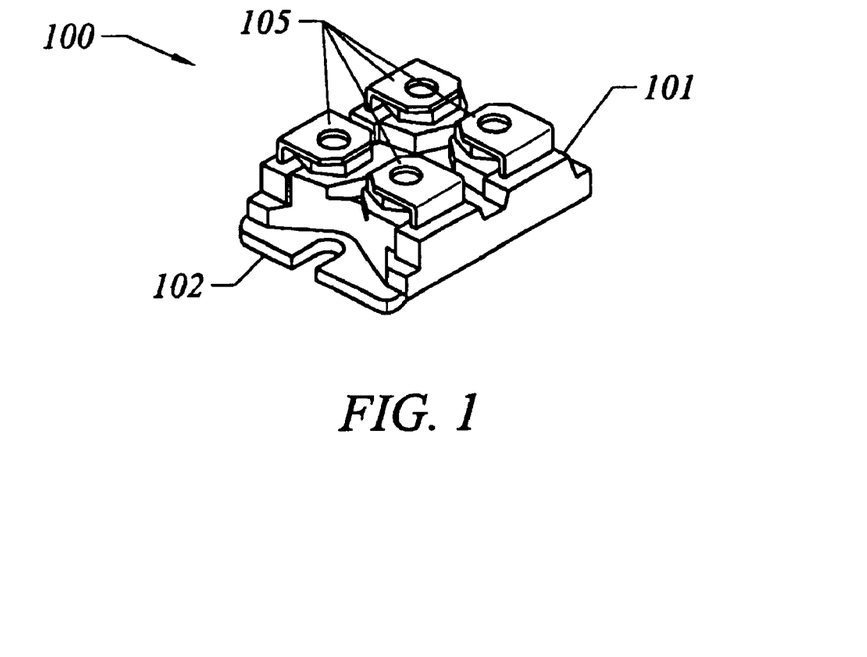
FIG. 1 illustrates a cross sectional view of a conventional SOT power device.

FIG. 1 illustrates a conventional power device 100 having SOT class of packages ("SOT power device"), e.g., SOT 227 and SOT 227B. Such a power device has a higher power semiconductor than typical single in-line packaged devices such as TO 220, TO247, and TO264. Those skilled in the art will appreciate that the SOT class of packages and TO class of package are Joint Electronic Device Engineering Council ("JEDEC") standard package configurations that are often used with power semiconductor die to produce packaged power semiconductor devices.

Generally, SOT power devices are configured to handle blocking voltages from 70 to 1000 volts, output currents from 36 to 340 amperes, and output power from 500 to 700 watts. Alternatively, they may handle blocking voltages of up to 1500 volts, or even up to 2000 volts. As used herein, the term "SOT power device" refers to any power device that is compatible with the SOT class of packages as listed above or a power device having a plurality of leads overlying a top surface of the power device. Although four terminal leads are shown in the present examples of the SOT class of packages, they may have different number of terminal leads, e.g., six terminal leads. As used herein, the term "SOT 227" refers to SOT 227 or any other present and future variation or version of SOT 227 including SOT 227B.

Figure 2:
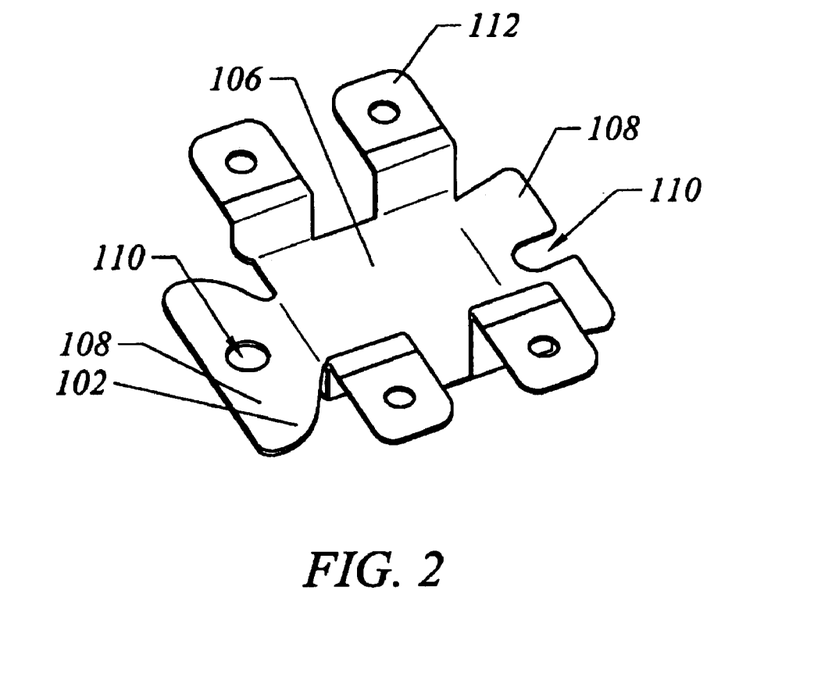
FIG. 2 illustrates a metal back plate of the power device of FIG. 1.
Figure 3:
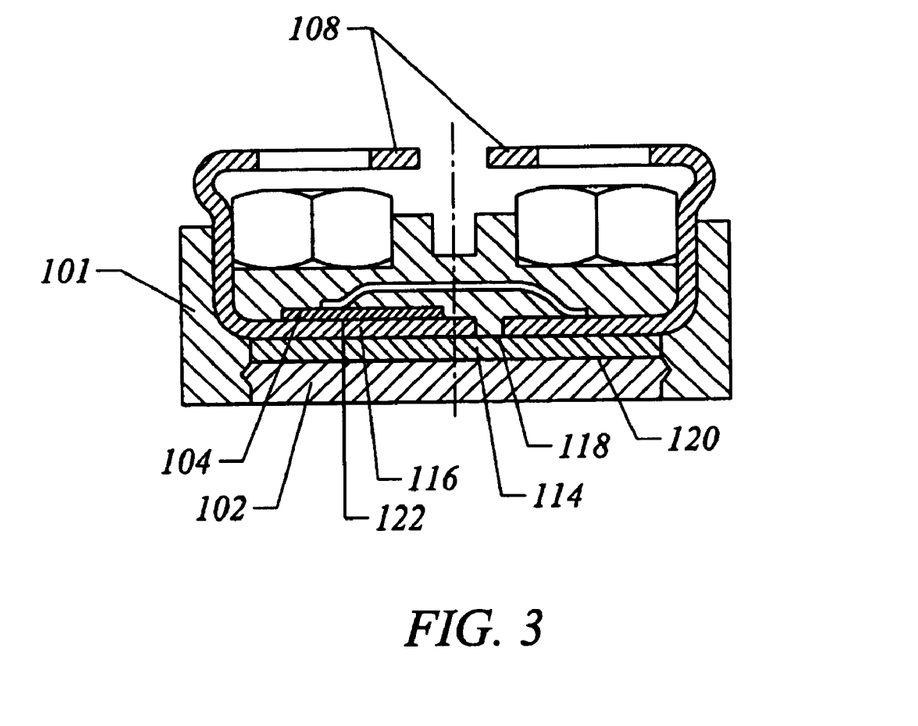
FIG. 3 illustrates a cross-sectional view of the power device of FIG. 1.

Referring to FIGS. 1–3, the device 100 has a package 101, a copper base plate 102 that is isolated from a semiconductor die 104, and a plurality of terminal leads 105. The base plate 102 is shown in more detail with the plastic package removed from the device in FIG. 2. As shown, the base plate 102 includes a main body 106 to receive the die 104 and dissipate heat generated by the die and a plurality of extensions 108 extending outwardly from the main body. The extensions 108 includes holes or openings 110 extending therethrough to receive screws, bolts, or the like to securely attach the device 100 to another device, such as a heat sink. FIG. 2 also shows a lead frame 112 coupled to the base plate 102 to provide the terminal leads 105.

Figure 4:
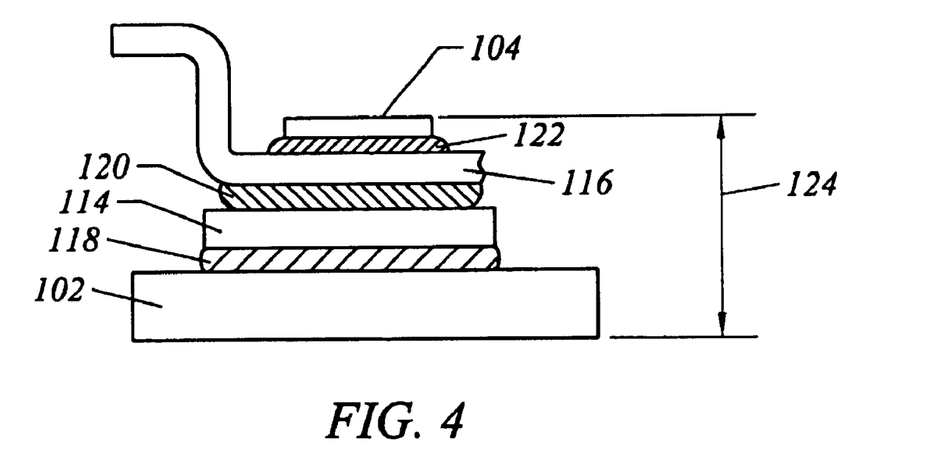
FIG. 4 illustrates an enlarged view of a lower portion of the power device of FIG. 3.

Referring to FIGS. 3 and 4, the device 100 has a multi-layered, relatively thick structure. FIG. 3 shows a cross-sectional view of the device 100, and FIG. 4 shows an enlarged view of a lower portion of the device 100 to highlight the multi-layered structure. As shown, the device has a multi-layered structure including the base plate 102, a ceramic substrate 114 provided over the base plate, a lower portion of the lead frame 116, and the semiconductor die 104. The base plate is solder bonded to a lower surface of the ceramic substrate 114, and the lower portion of the lead frame 112 is solder bonded to an upper surface of the ceramic substrate 114, as indicated by solder layers 118 and 120. The semiconductor die 102, in turn, is solder bonded to the lower portion of the lead frame 112, as indicated by a solder layer 122.

Accordingly, the device 100 has at least seven layers of materials from the die 104 to the base plate 102. Each of these layers has to be bonded in an assembly process with high precision to minimize formation of any voids in the joints; consequently, greater the layers, greater the material and production costs. In addition, the thermal resistance of the device from the die to the base plate increases with the increased layers or increased thickness of a lower portion of the device. For example, a lower portion of the device 100, i.e., from a lower surface of the die 104 to a lower surface of the back plate 102, has a thickness 124 of about 0.143 inch. Moreover, the solder layers tends to be much less thermally conductive than metals such as copper or aluminum. For example, solder has thermal conductivity of 33 W/mk/° C., whereas copper has thermal conductivity of 393 W/mk/° C.

As a result, the device 100 requires a highly thermally conductive dielectric material, e.g., aluminum nitride (AlN) which has 217 W/mk/° C. or beryllia (BeO) which has 251 W/mk/° C. for the ceramic substrate 114. Due to toxic nature of beryllia, aluminum nitride is the preferred choice for the ceramic substrate 114. Although alumina ($Al_2O_3$) is relatively inexpensive compared to AlN, alumina typically is not used for the device 100 since its relatively low thermal conductivity of 17 W/mk/° C. makes it unsuitable for the device 100.

Figure 5:
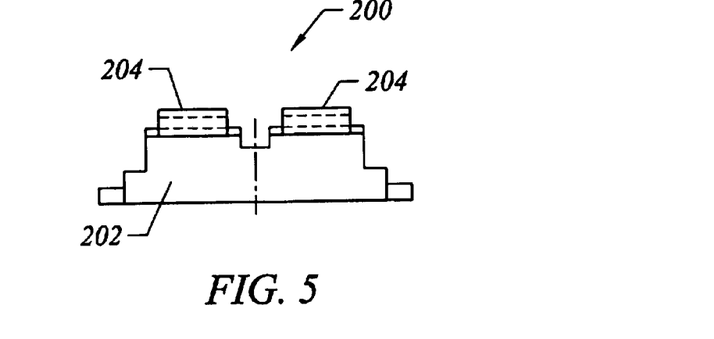
FIG. 5 illustrates a first side elevational view of an SOT power device according to one embodiment of the present invention.
Figure 6:
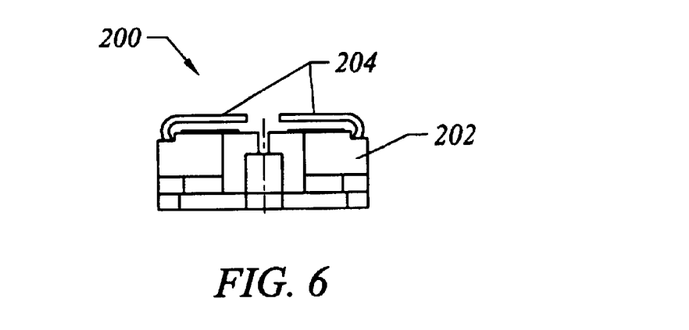
FIG. 6 illustrates a second side elevational view of the SOT power device of FIG. 5, wherein the second side view is in an orthogonal direction to the first side view.
Figure 7:
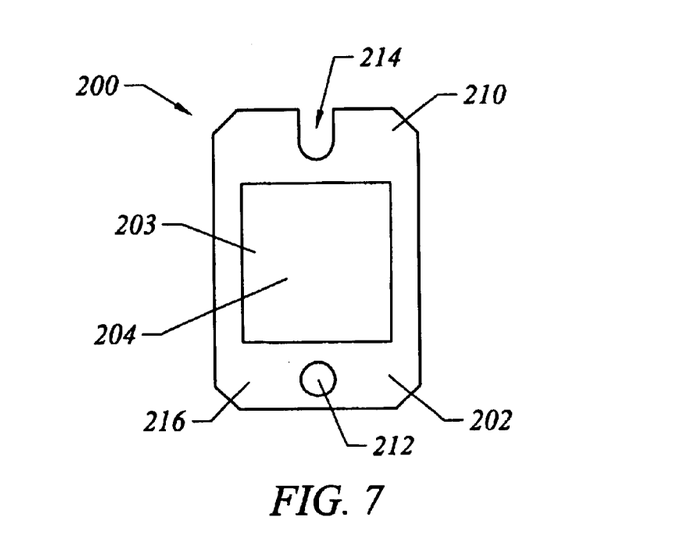
FIG. 7 illustrates a bottom plan view of the SOT power device of FIG. 5.

FIGS. 5–8 illustrate a power device 200 having a plastic package 202 and a direct bonded metal substrate 204 according to one embodiment of the present invention. In one embodiment, the substrate 204 uses alumina rather than aluminum nitride as its ceramic substrate. FIG. 5 shows a first side elevational view of the device, and FIG. 6 shows a second side elevational view of the device, where the first and second side views are views with 90 degree shifts from each other. FIG. 7 shows a bottom plan view of the device 200 including the plastic package 202 and a backside of the direct bonded metal substrate 204, which may be copper, aluminum or other conductive metal, as explained in greater detail later.

Figure 8:
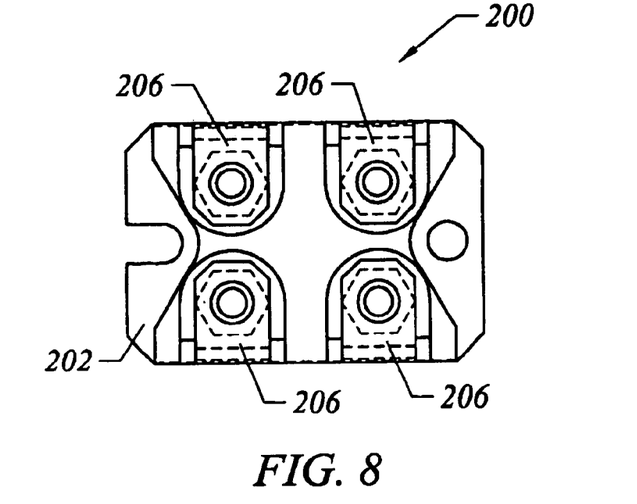
FIG. 8 illustrates a top plan view of the SOT power device of FIG. 5.

The plastic package includes a first extension 210 extending outwardly from the direct bonded metal substrate in a first direction and a second extension 212 extending outwardly from the direct bonded metal substrate in a second direction that is in opposite direction from the first direction. The first and second extensions are plastic, unlike in the device 100, and have holes 214 and 216 extending through the extensions to facilitate mounting of the device 200 to another device, e.g., a heat sink. The holes 214 and 216 are configured to receive screws, bolts, nails, or the like. FIG. 8 shows a top plan view of the device, where the leads are overlying a top surface of the device 200.

When seen externally, the device 200 includes the plastic package 202, a backside (or lower surface) of the direct bonded metal 204, and a plurality of leads 206 extending outwardly from the package. Generally, a lower surface or backside of the plastic package 202 is flushed to the backside of the direct bonded metal 204. In another embodiment, the backside of the direct bonded substrate 204 may extend slightly below the backside of the package 202. Although not seen from outside, the device 200 includes, as in the device 100, a semiconductor die (not shown) enclosed within the package 202 to regulate electrical current.

The device 200 is designed to operate at about 70 to 1000 volts ($V_{DS}$), generate current ($I_{DS}$) of about 30 to 350 amperes, and handle output power of about 500 to 700 watts. In another embodiment, the device 200 is designed to operate up to 1500, 2000, or 3000 volts ($V_{DS}$) and generate current ($I_{DS}$) up to 400, 500, or 1000 amperes. In one embodiment, the device 200 is a discrete device having a single semiconductor die enclosed within the package.

Figure 9:
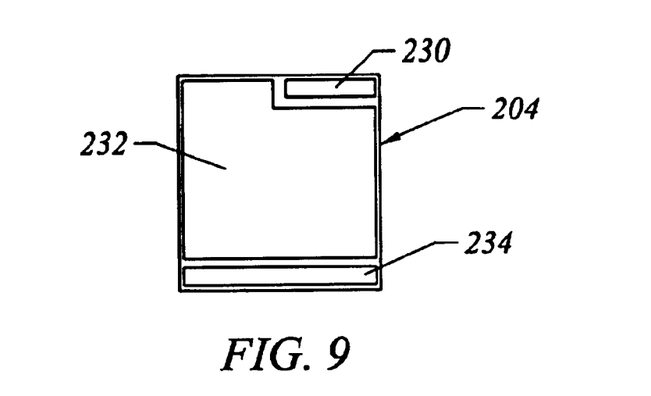
FIG. 9 illustrates a top plan view of a direct bonded metal substrate according to one embodiment of the present invention.
Figure 10:
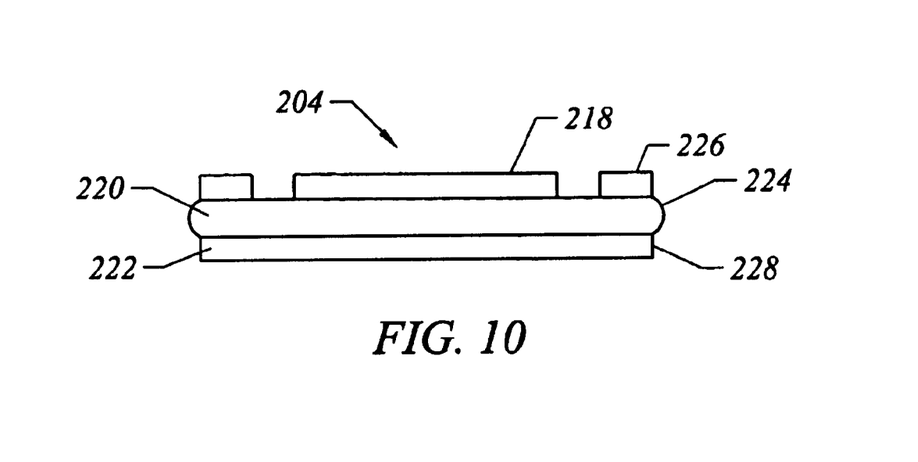
FIG. 10 illustrates a cross-sectional view of the direct bonded metal substrate of FIG. 9.

FIG. 9 depicts a top plan view of the direct bonded metal substrate 204 of the device 200, and FIG. 10 depicts a cross sectional view of the direct bonded metal substrate 204, according to one embodiment of the present invention. The direct bonded metal substrate 204 has a first conductive (front side) layer 218 that is bonded to a second dielectric layer 220, typically of ceramic material, that is in turn bonded to a third conductive (backside) layer 222. As used herein, the term "first and third conductive layers" also may be referred to as "first and second conductive layers." In one embodiment, each of conductive layers is about 0.0118 inch (0.30 mm) thick, and the dielectric layer is about 0.0248 inch (0.630 mm) thick, making the direct bonded metal substrate 204 about 0.0484 inch (1.230 mm) thick overall. These thicknesses are given merely as examples, and thicker or thinner layers could be used. The dielectric layer 220 generally has an outer edge 224, which extends beyond outer edges 226 and 228 of the first and third conductive layers, thereby providing better electrical isolation of the two conductive layers.

The direct bonded metal substrate may be a direct copper bonded (DCB) or direct aluminum bonded (DAB) substrate. The DCB substrates have copper as the first and second conductive layers, and the DAB substrates have aluminum as the first and second conductive layers. In one embodiment, the substrate 204 may have different metals for the first and third conductive layers.

Compared to solder bonded layers, the direct bonded metal substrates provide superior thermal conductivity due to its "eutectic bond" between the conductive layers and the dielectric layer. The eutectic bonding provides more intimate bonding and eliminates the use of solder which has lower thermal conductivity. Elimination of the use of solder also reduces the thickness of the substrate 204. In the present exemplary embodiment, the substrate 204 is about 0.049 inch thick which is substantially less than the thickness 124 of the device 100. In one embodiment, the above features, which enhance the thermal conductivity of the device 200, enable the use of relatively inexpensive aluminum oxide or alumina as the second dielectric layer 220, thereby lowering the manufacturing costs of the device 200. In another embodiment, the dielectric layer is aluminum nitride, beryllia (BeO), or other insulating material compatible with direct bonded metal substrate fabrication.

Figure 11:
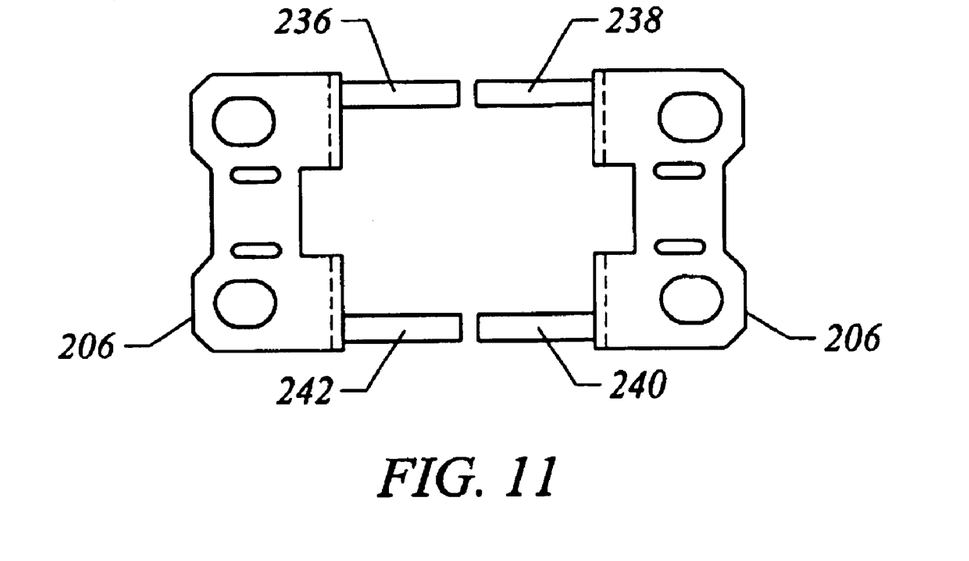
FIG. 11 illustrates a top plan view of a lead frame according to one embodiment of the present invention.

Referring to FIGS. 9–11, the first conductive layer 218, e.g., a copper layer, is patterned to have a plurality of conductive islands or blocks 230, 232, and 234 that are separated by the ceramic layer 224 provided therebelow (FIG. 10). The conductive block 232 is configured to receive a semiconductor die thereon and a bonding portion 236 of a lead 206 (FIG. 11). On the other hand, the conductive blocks 230 and 234 are configured to receive bonding portions 238, 240, and 242 of a lead 206. These bonding portions of the leads 206 are soldered to the respective blocks of the first conductive layer 218.

Figure 12:
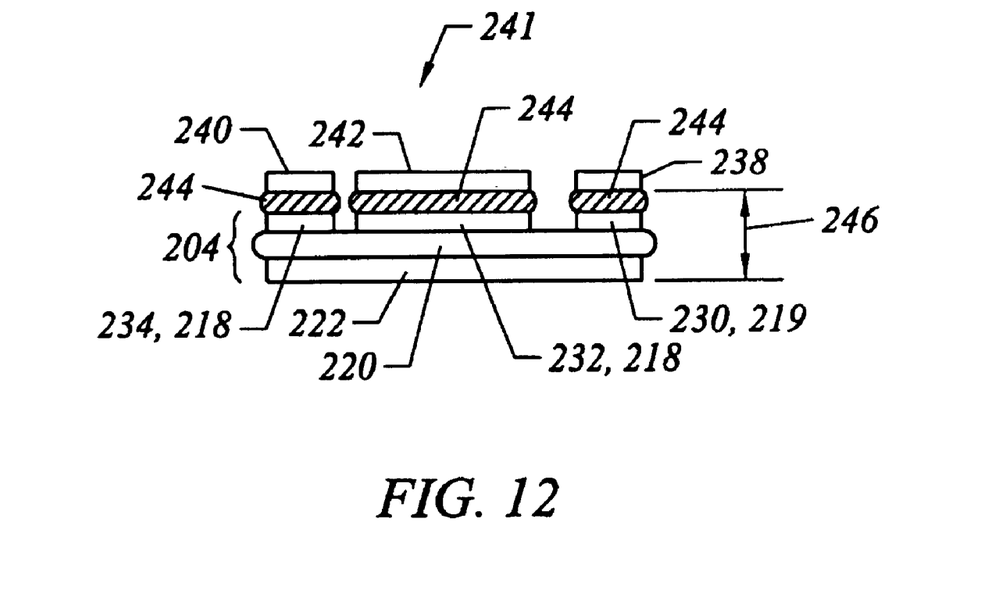
FIG. 12 illustrates a cross-sectional view of a lower portion of an SOT power device according to one embodiment of the present invention, wherein the figure illustrates a semiconductor die and a plurality of bonding portions of a lead frame bonded to a direct bonded metal substrate.

FIG. 12 illustrates a cross-sectional view of a lower portion 241 of the device 200 without the plastic package 202, according to one embodiment of the present invention. A semiconductor die 242 with one or more transistors defined thereon is bonded to the block 232 of the first conductive layer 218. Various conductive regions, such as, gate, source, and drain regions, are electrically coupled to the leads via wires (not shown) extending from the die to the leads. In one embodiment, the wires are aluminum wires but other conductive wires may be used, such as copper, gold, or the like. The bonding portions 238 and 240 are solder bonded to the blocks 230 and 234, respectively, as indicated by a solder layer 244.

Bonding the die and bonding portions to the blocks of the first conductive layer 230, as shown in FIG. 12, facilitates manufacturing of a plurality of the devices 200 in a single assembly process, as will be described in more detail later. In addition, as compared with FIG. 4, the device 200 has less layers than the device 100. For example, the device 200 shows five layers of materials in FIG. 12 in contrast to seven layers of materials in FIG. 4. A thickness 246 from a lower surface of the die 242 to a lower surface of the third conductive layer 222 is about 0.050 inch, which is slightly thicker than the thickness of the DCB substrate 204 due to the solder layer 244, according to one embodiment of the present invention. Nevertheless, the thickness 246 of the device 200 is substantially less than the thickness 124 of the device 100. In another embodiment, the thickness 246 is no more than 0.060, 0.080, or 0.100 inch.

The DCB substrate 204 eliminates the use of solder to bond the first and second conductive layers to the dielectric layer. Also, the DCB substrate 204 eliminates the need for a base plate, such as the base plate 102, since the second conductive layer 222 may be used to dissipate heat.

The power device 200 having the DCB substrate 204 tends to provide greater structural integrity. The substrate, on which the semiconductor die, is provided is less likely to crack because the composite DCB structure provides better support for the ceramic layer.

The backside copper layer or second conductive layer 222 also improves the thermal performance of the power device 200. The temperature in the vicinity of the die ("underneath" the die) tends to be higher than the temperature at the edge of the ceramic layer 220. Although the extent of this heat gradient depends on many factors, the backside copper layer 222 effectively spreads the heat across the entire ceramic layer, thereby reducing the formation of a hot-spot underneath the die. More effective heat distribution also reduces heat-related stress and resultant cracking of the substrate and/or die, thus improving reliability.

Additionally, the direct-bonding process, described below, intimately attaches the copper to the ceramic (i.e., creates a "eutectic bond" between the copper and ceramic) and provides excellent thermal conduction from one layer to the other. This thermal conduction provided by the copper layer 222 is better than that typically provided by contacting a bare ceramic substrate to a heatsink. Relatively high thermal resistance of the ceramic impedes lateral heat spreading, so that each microscopic contact point with the heatsink becomes a hot-spot. In contrast, the heat-conductivity of the backside copper layer 222 provides good lateral heat conduction and reduces the consequences of localized contact with the heatsink.

Figure 13:
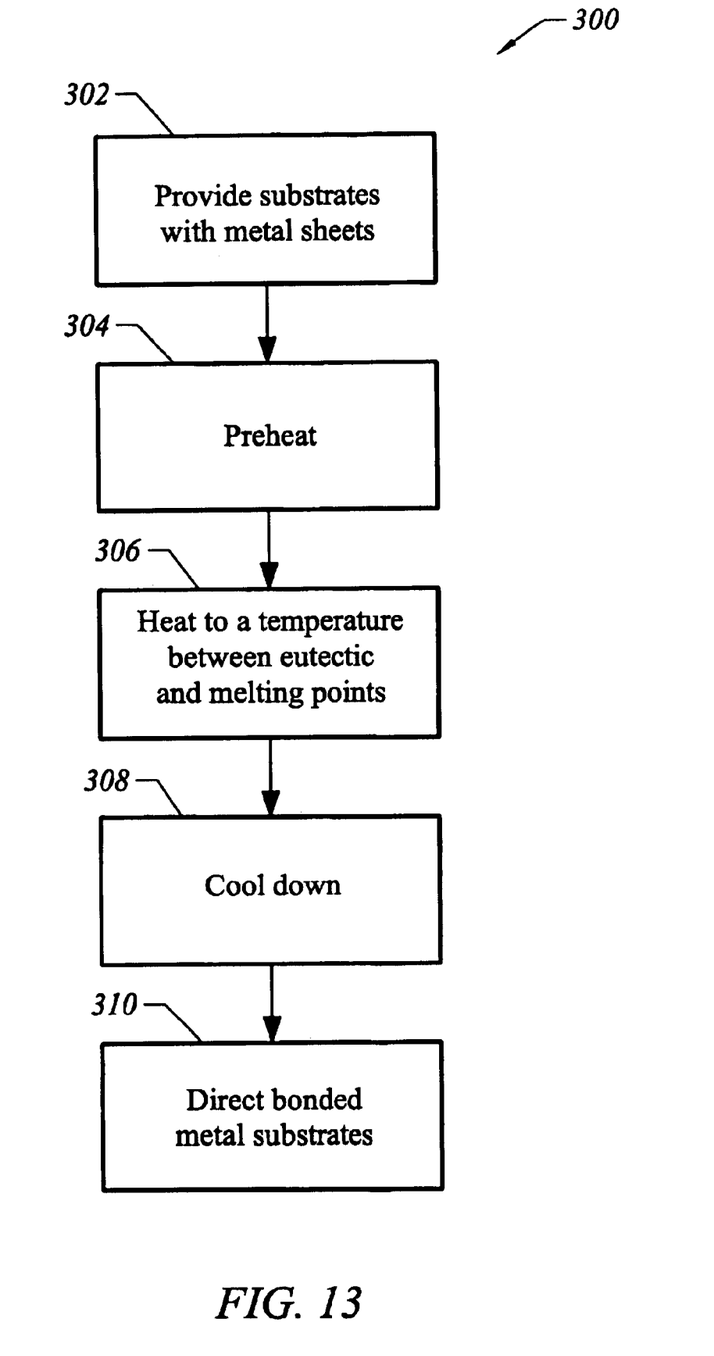
FIG. 13 illustrates a process of manufacturing a direct bonded substrate according to one embodiment of the present invention.

FIG. 13 depicts a method 300 for forming the direct bonded metal substrate 228, e.g., a DCB substrate, according to one embodiment of the present invention. A detailed description of manufacturing the direct bonded metal substrate according to one embodiment is provided in U.S. Pat. No. 4,483,810, which is incorporated by reference for all purposes.

Generally, the method involves placing a conductive or metal substrate on a dielectric or ceramic substrate and heating them to a temperature between the eutectic temperature and the melting temperature of the conductive substrate. For example, a metal substrate, e.g., copper, is placed on a ceramic substrate (step 302). A thin oxide layer may be formed over the copper substrate on the side facing the ceramic substrate or on the both sides. The copper and ceramic substrates are placed in a carrier, preferably of silicon carbide or graphite core with a silicon carbide coating, and inserted into a furnace. The copper and ceramic substrates are preheated (step 304). The preheat step is typically performed in a first zone within the furnace to gradually ramp up the temperature of the substrates. The first zone may include a plurality of sub-zones in one embodiment. The temperature within the first zone is kept at no more than about 960° C. in one embodiment of the present invention.

The copper and ceramic substrates are heated to a temperature between eutectic and melting temperatures of copper (step 306). Generally, the substrates are moved into a second zone within the furnace during this step. In one embodiment, the peak temperature within the second zone is less than 1083° C., preferably about 1071° C., to raise the temperatures of the substrates to above the eutectic temperature of copper, which is about 1065° C. As a result a eutectic melt is formed between the copper substrate and the ceramic substrate.

The substrates are cooled to a predetermined temperature to solidify the eutectic melt (step 308). Generally, the substrates are moved to a third zone within the furnace. The solidification of the eutectic melt does not occur instantaneously, and the bonding process is not completed until the temperature drops well below the eutectic temperature, usually about 100° C. below the eutectic temperature. The cooling process generally involves two or more steps to gradually ramp down the temperature during a period of about 20 minutes. The resulting product is a direct bonded copper substrate, such as the DCB substrate 204 (step 310).

Figure 14:
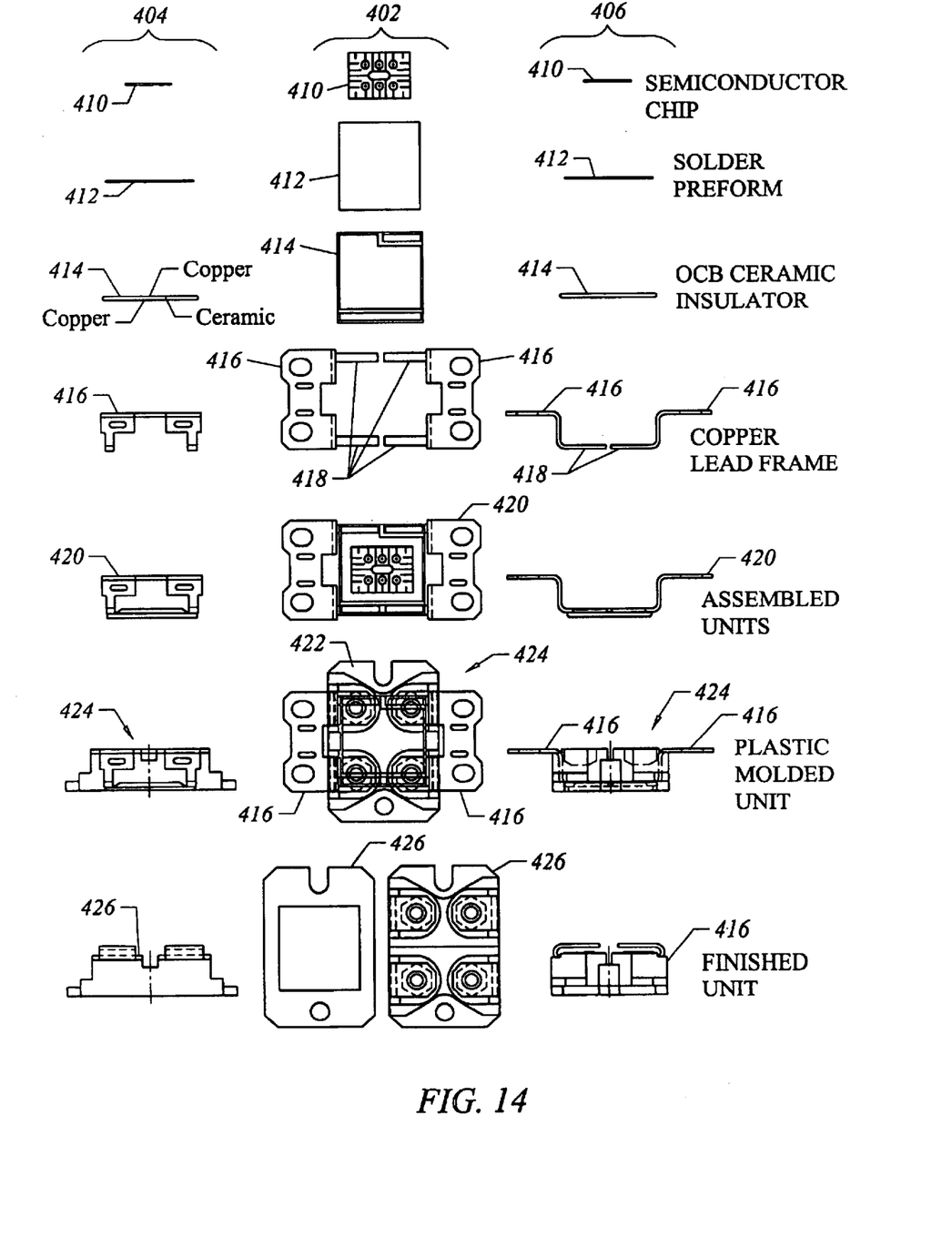
FIG. 14 illustrates an exploded view of the components used to manufacture an SOT power device according to one embodiment of the present invention.

FIG. 14 provides an exploded view of the components used to manufacture the device 200 according to one embodiment of the present invention. Reference numeral 402 depicts top or bottom plan views of various components used to manufacture the device 200. Reference numeral 404 depicts first side elevational views of the various components, where the second side views are orthogonal to the first side views. Reference numeral 406 depicts second side elevational views of the various components.

As shown, a semiconductor die 410 is provided over a solder preform 412 that is, in turn, placed on a DCB substrate 414. A plurality of leads 416 having a plurality of bonding portions 418 are provided over the solder preform 412, where the bonding portions 418 are aligned to the respective conductive blocks on the DCB substrate 414. Various conductive regions of the die 410 are wire bonded to the bonding portions of the leads 416 to provide an assembled unit 420. A package 422 is formed to enclose the die 410 to provide a plastic molded unit 424. The leads 416 of the unit 424 are bent to have the leads overly a top surface of the unit 424, thereby obtaining a finished SOT power device 426.

While the invention has been particularly shown and described with reference to a specific embodiment thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A power device compatible with an SOT 227 package standard, the device comprising:
   a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other, the first conductive layer being patterned to provide at least first and second conductive blocks;
   a semiconductor die being bonded to the first block of the first conductive layer of the substrate; and
   a terminal lead coupled to the second block of the first conductive layer of the substrate,
   wherein a distance from a lower surface of the die to a lower surface of the third conductive layer is no more than about 0.6 inch.

2. The power device of claim 1, wherein all edges of the first block beyond corresponding edges of the die, wherein the SOT 227 standard includes an SOT 227B standard.

3. The power device of claim 1, further comprising:
   a plastic package to enclose and protect the semiconductor die.

4. The power device of claim 3, wherein a backside of the plastic package defines a backside of the power device.

5. The power device of claim 4, wherein the backside of the plastic package exposes a lower surface of the second conductive layer of the substrate.

6. The power device of claim 5, wherein the backside of the plastic package is flushed to a lower surface of the lower surface of the second conductive layer.

7. The power device of claim 3, wherein the plastic package includes:
   a first extension extending outwardly from the substrate in a first direction; and
   a second extension extending outwardly from the substrate in a second direction,
   wherein surfaces of the first and second extensions define first and second openings, respectively, to facilitate mounting of the power device to a surface of a device.

8. The power device of claim 1, wherein the substrate is a direct bonded metal substrate.

9. The power device of claim 1, wherein the substrate is a direct copper bonded substrate, wherein the first and third conductive layers are copper layers.

10. The power device of claim 1, wherein the substrate is a direct aluminum bonded substrate, wherein the first and third conductive layers are aluminum layers.

11. The power device of claim 10, wherein the second dielectric layer is $Al_2O_3$.

12. A power device satisfying SOT-227 package standard, the device comprising:
   a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other, the first conductive layer being patterned to provide at least first and second conductive blocks;
   a semiconductor die having a lower surface, the lower surface of the die bonded to the first block of the first conductive layer of the substrate;
   a terminal lead coupled to the second block of the first conductive layer of the substrate; and
   a plastic package having a backside and substantially enclosing the die and exposing a lower surface of the second conductive layer,
   wherein the backside of the plastic package and the lower surface of the third conductive layer define a backside of the power device, wherein a distance from the lower surface of the die to the lower surface of the third conductive layer is no more than about 0.06 inch.

13. An SOT power device, comprising:

a direct bonded metal substrate including first and second conductive layers separated by a dielectric layer, so that the first and second conductive layers are electrically isolated; and a semiconductor die provided on the first layer of the direct bonded substrate, wherein a distance from a lower surface of the die to a lower surface of the direct bonded substrate is no more than about 0.8 inch.

14. The power device of claim 13, further comprising:

plastic encapsulant to enclose the die and portions of the substrate, where a backside of the second conductive layer is exposed to form a backside of the power device, wherein a distance from the lower surface of the die to the lower surface of the direct bonded substrate is no more than about 0.6 inch.

15. The power device of claim 13, wherein the direct bonded metal substrate is a direct aluminum bonded substrate.

16. The power device of claim 13, wherein power device satisfies SOT 227 package standard.

17. The power device of claim 13, wherein the power device is a discrete power device with a single semiconductor die.

18. An SOT power device, comprising:

a direct aluminum bonded metal substrate including first and second aluminum layers separated by a dielectric layer, so that the first and second aluminum layers are electrically isolated; and a semiconductor die provided on the first layer of the direct bonded substrate, wherein a distance from a lower surface of the die to a lower surface of the second aluminum layer is no more than about 0.06 inch.

19. The power device of claim 18, wherein the dielectric layer is $Al_2O_3$.

20. The power device of claim 18, wherein the dielectric layer is AlN.

21. A power device satisfying SOT 227 package standard, comprising:

a substrate including a first aluminum layer, a second dielectric layer, and a third aluminum layer, the first and third aluminum layers being electrically isolated from each other, the first aluminum layer having been patterned to provide at least first and second conductive blocks;

a semiconductor die being bonded to the first block of the first aluminum layer of the substrate;

a terminal lead coupled to the second block; and a plastic package to enclose the die and portions of the substrate, where a backside of the second aluminum layer is exposed to enable the backside to be joined to a heat sink to dissipate heat generated by the power device.

22. A method for fabricating a power device satisfying SOT 227 package standard, the method comprising:

providing a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other;

bonding a semiconductor die to the first conductive layer of the substrate; and enclosing the semiconductor die within a plastic packages, wherein a distance from a lower surface of the die to a lower surface of the third conductive layer is no more than about 0.06 inch.

* * * * *